United States Patent [19]

Schaller

[11] Patent Number: 5,565,789

[45] Date of Patent: Oct. 15, 1996

[54] PROCESS FOR ENCODING PRINTED CIRCUIT BOARDS

[75] Inventor: Günter Schaller, Breitenbrunn/Opf., Germany

[73] Assignee: Temic Telefunken microelectronic GmbH, Heilbronn, Germany

[21] Appl. No.: 424,615

[22] Filed: Apr. 19, 1995

[30] Foreign Application Priority Data

Apr. 21, 1994 [DE] Germany ............... 44 13 910.1

[51] Int. Cl.$^6$ ................. G01R 31/02; G01N 21/00
[52] U.S. Cl. ................ 324/764; 324/501; 356/237
[58] Field of Search ................ 324/764, 754, 324/501; 356/237; 348/87; 29/832, 833

[56] References Cited

U.S. PATENT DOCUMENTS

| 3,238,455 | 3/1966 | Jankowski | 324/754 |
|---|---|---|---|
| 4,405,233 | 9/1983 | Grau | 324/501 |

FOREIGN PATENT DOCUMENTS

| 2641181 | 1/1978 | Germany . |
| 9214838 | 2/1993 | Germany . |
| 60-253854 | 4/1986 | Japan . |
| 01-007600 | 4/1989 | Japan . |
| 04-010488 | 4/1992 | Japan . |
| 04-317386 | 3/1993 | Japan . |
| 04-348583 | 4/1993 | Japan . |
| 05-013899 | 5/1993 | Japan . |
| 05-145206 | 9/1993 | Japan . |
| 05-183243 | 11/1993 | Japan . |

OTHER PUBLICATIONS

Patent Abstracts of Japan, vol. 10, No. 160 (P–465), [2216], 7 Jun. 1986 & JP–A–61–014549 (Fujitsu) 22 Jan. 1986.

*Primary Examiner*—Ernest F. Karlsen
*Attorney, Agent, or Firm*—Spencer & Frank

[57] ABSTRACT

For automatic population of printed circuit boards, automatic populating machines frequently need to be able to detect different population variants. This invention describes a simple and reliable process for identifying printed circuit boards to clearly distinguish between population variants within a production run comprising several population processes. According to this invention, a printed circuit board features termination nests for at least one encoding component, and with an encoding aperture being provided in these termination nest areas that can be closed by the aforementioned encoding component. Thus two population variants can be encoded, that is, a first variant where the printed circuit board will be part-populated without such an encoding component in its first population run, and a second variant where the printed circuit board will be part-populated with this encoding component in its first population run.

8 Claims, 1 Drawing Sheet

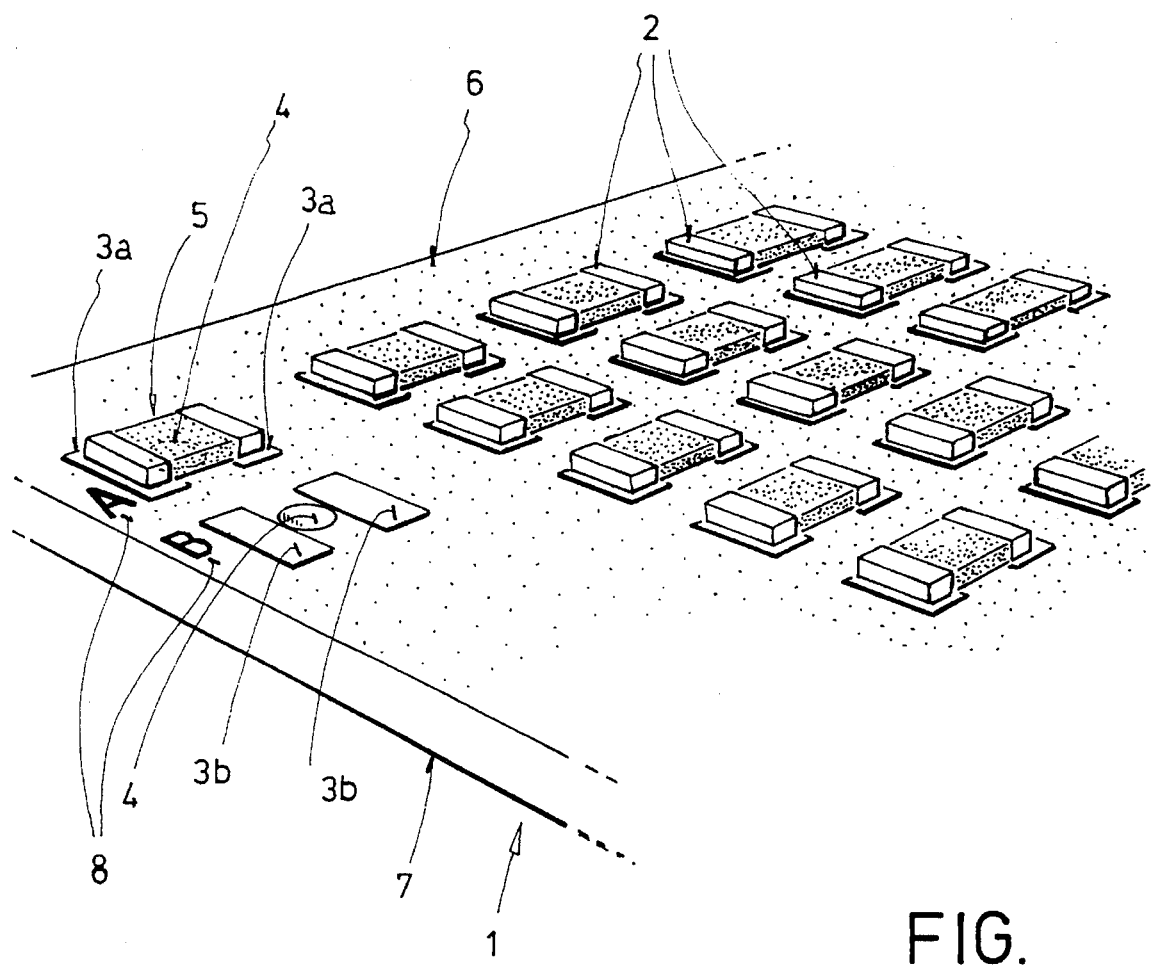

5,565,789

PROCESS FOR ENCODING PRINTED CIRCUIT BOARDS

BACKGROUND OF THE INVENTION

This invention concerns a process for encoding printed circuit boards to detect automatically at least two population variants of these printed circuit boards for a production run comprising several population processes to populate printed circuit boards with electronic and non-electronic components.

Frequently, in industrial manufacturing of electronic assemblies, different variants with special or auxiliary functions are produced, and the associated printed circuit boards differ then in that they all feature different populations, leading to a certain number of population variants. To save on costs in the production process, there is an attempt to cover this great variety of variants by using just one basic printed circuit board. However, the problem then is that the automatic populating machine must itself now detect these various population variants at each production step. There is a danger of possible mix-ups during the production run.

It is well known that in order to uniquely identify printed circuit boards with regard to their different population variants, stick-on labels or bar codes are used; however, this involves additional labour and material costs, and thus gives rise to additional production costs. For printed circuit boards populated on both sides, there is the additional problem that such stick-on labels or bar codes will be readable from one side only.

SUMMARY OF THE INVENTION

The object of this invention is to provide a machine-readable encoding of printed circuit boards which is easy to attach to these boards and features a high degree of reliability with regard to detection by the machine.

According to the invention, this process will be carried out using printed circuit boards which respectively feature termination nests for at least one encoding component, and with an encoding aperture being provided in these termination nest areas that can be closed by the aforementioned encoding component. Thus, two population variants can be encoded depending on whether, in the first population process, a printed circuit board has been part-populated with or without an encoding component. As a rule, this encoding component represents a standard component which the populating machine will place on the board in addition to the other components at the specific termination nest in question. As the encoding aperture is fined between the termination spots of the encoding component which make tip this termination nest, this aperture can be detected by means of a photovoltaic barrier. This provides an encoding which is machine-readable from both sides, as it can also be detected from underneath the board. Thus, an automatic populating machine will now be able to check the position of this encoding aperture before each populating run, and, depending on whether this encoding aperture is closed or open, select the relevant population variant.

If more than two population variants need to be detected by the populating machine, an appropriate number of encoding apertures is to be provided on the printed circuit board.

The proposed identification according to this invention is extremely cost-effective and compact, as no additional process step for attaching an encoding, for example, labels or bar codes, will be necessary. On the other hand, populating the board with such an encoding component will be hardly noticeable. Also, there will be no need for technical modifications to the populating machine as all populating machines will normally be equipped with a position camera.

Furthermore, there will be no danger of printed circuit boards belonging to different population variants being mixed up, as the populating machine will check each individual printed circuit board, and as the encoding will remain detectable during the entire production run, i.e., until the final measuring set is reached.

Finally, it is advantageous that populating machine operators will also be able to clearly detect this encoding during each process step.

The process according to this invention can be advantageously used for populating printed circuit boards with SMD (surface mounted device) components. As the encoding according to this invention can be detected from both sides, this process can also be used for printed circuit boards which are to be populated on two sides.

BRIEF DESCRIPTION OF THE DRAWINGS

Below, the process according to this invention will be explained with reference to the FIGURE provided, and using a printed circuit board populated with SMD components.

DESCRIPTION OF THE PREFERRED EMBODIMENTS

This FIGURE shows a printed circuit board 1, part-populated with SMD components 2, following a first populating process within a production run comprised of several such populating processes. An encoding located on reflow side 6 consists of two termination nests 3a and 3b complete with two termination spots each, with the first-mentioned termination nest 3a being populated by an encoding component 5 designed as a standard SMD component. Between the two termination spots of each termination nest 3a and 3b, encoding apertures 4 through printed circuit board 1 will be respectively provided. The encoding aperture 4 of termination nest 3a will be closed by encoding component 5, whilst the encoding aperture 4 of termination nest 3b will remain open. Together with the first populating process, printed circuit board 1 will be populated not only with this encoding component 5 but also with the SMD components 2 provided for reflow side 6.

Before its next populating process, i.e. before populating flow solder side 7, the automatic populating machine will use a position camera to check whether encoding apertures 4 are closed or open, and will thus be able to clearly and uniquely identify one of four possible population variants for this printed circuit board 1. The printed circuit board shown in the FIGURE attached may be designated as a base board, as this printed circuit board will now be populated in the next populating process with the relevant components specific to each variant.

Even when populating flow solder side 7 is complete, this identification can be used for subsequent critical production stages where there is a danger of confusion and mix-ups, such as riveting on a connector strip. The FIGURE also shows a further designation 8 with capital letters A and B which serves as a population imprint to designate the population variant. In this way populating machine operators will be able to identify the relevant printed circuit board more easily.

The encoding process according to this invention is very compact on the one hand, as stick-on labels and bar codes would use more surface area on the printed circuit board than the encoding component according to this invention, and on the other hand, it is also very cost-effective, as additional process steps for fitting an encoding by means of, e.g., labels or bar codes, will not be required, and populating machines do not need to be technically modified because all such machines are normally equipped with a position camera. Furthermore, only one set of documentation for one printed circuit board needs to be prepared and maintained.

A further advantage is that there are several possibilities for reading these encodings: for instance, by means of optical sensors, electric contacts, or mechanical detection of the encoding aperture, or by visual inspection by operators.

Finally, the process according to this invention will also achieve a high degree of detection reliability, as an encoding component cannot become detached or illegible.

Naturally, use of the process according to this invention will not only be applicable to populating printed circuit boards with SMD components as described in this example of an embodiment but can also be used for populating printed circuit boards with any type of components.

What is claimed is:

1. Process for encoding printed circuit boards to detect automatically at least two population variants of these printed circuit boards for a production run comprising several population processes to populate printed circuit boards with electronic components, said process comprising the steps of: providing the printed circuit boards with respective termination nests for at least one encoding component; providing an encoding aperture in these termination nest areas such that the respective apertures can be closed by the aforementioned encoding component, whereby, for a first population variant, the printed circuit board will be part-populated without such an encoding component in a first population run, and, for a second population variant, the printed circuit board will be part-populated with this encoding component in the first population run.

2. Process according to claim 1 wherein SMD (surface mounted device) components are to be used as electronic components.

3. Process according to claim 1 wherein the printed circuit boards used can be populated from both sides.

4. Process according to claim 2 wherein the printed circuit boards used can be populated from both sides.

5. Process for encoding printed circuit boards and for detecting automatically at least two population variants of these printed circuit boards for a production run comprising several population processes to populate printed circuit boards with electronic components, said process comprising the steps of: providing each printed circuit board with a termination nest for at least one encoding component; providing an encoding aperture that can be closed by an encoding component in the area of each termination nest for an encoding component; directing light through each encoding aperture; and detecting light passing through an encoding aperture to identify one of a first population variant wherein the printed circuit board will be part-populated without such an encoding component in a first population run, and a second population variant wherein the printed circuit board will be part-populated with this encoding component in the first population run.

6. Process according to claim 5 wherein the electronic components are SMD (surface mounted device) components.

7. Process according to claim 6 wherein the printed circuit boards used are to be populated from both sides.

8. Process according to claim 6 wherein the printed circuit boards used are to be populated from both sides.

* * * * *